United States Patent
Johnson et al.

(10) Patent No.: US 10,202,705 B2
(45) Date of Patent: Feb. 12, 2019

(54) SILICON INGOT HAVING UNIFORM MULTIPLE DOPANTS AND METHOD AND APPARATUS FOR PRODUCING SAME

(75) Inventors: Bayard K. Johnson, Jefferson Hills, PA (US); John P. Deluca, Chesterfield, MO (US); William L. Luter, St. Charles, MO (US)

(73) Assignee: GTAT IP HOLDING LLC, Hudson, NH (US)

( * ) Notice: Subject to any disclaimer, the term of this patent is extended or adjusted under 35 U.S.C. 154(b) by 1721 days.

(21) Appl. No.: 13/446,353

(22) Filed: Apr. 13, 2012

(65) Prior Publication Data

US 2012/0301386 A1 Nov. 29, 2012

Related U.S. Application Data

(60) Provisional application No. 61/475,351, filed on Apr. 14, 2011.

(51) Int. Cl.
*C30B 15/04* (2006.01)
*C30B 29/06* (2006.01)
(Continued)

(52) U.S. Cl.
CPC ............ *C30B 15/04* (2013.01); *C30B 15/002* (2013.01); *C30B 15/12* (2013.01); *C30B 29/06* (2013.01);
(Continued)

(58) Field of Classification Search
CPC ....... C30B 15/002; C30B 15/04; C30B 15/12; C30B 29/06; H01L 31/182; Y02E 10/52;
(Continued)

(56) References Cited

U.S. PATENT DOCUMENTS 5,021,225 A * 6/1991 Yamashita ............... C30B 15/12
117/213
5,288,366 A * 2/1994 Holder .................... C30B 15/02
117/214
(Continued)

FOREIGN PATENT DOCUMENTS

CN 1041011 A 4/1990
EP 0350305 A2 * 1/1990
(Continued)

OTHER PUBLICATIONS

International Search Report dated Nov. 1, 2012 for PCT/US2012/033593.
(Continued)

*Primary Examiner* — Hua Qi
(74) *Attorney, Agent, or Firm* — Parker Ibrahim & Berg LLP; Stephen D. LeBarron

(57) ABSTRACT

A Czochralski growth system is disclosed comprising a crucible, a silicon delivery system comprising a feeder having a delivery point overhanging the crucible and delivering a controllable amount of silicon into the crucible, and at least one doping mechanism controllably delivering at least one dopant material to the feeder. The system can comprise two or more doping mechanisms each loaded with a different dopant material and can therefore be used to prepare silicon ingots having multiple dopants. The resulting ingots have substantially constant dopant concentrations along their axes. Also disclosed is a method of Czochralski growth of at least one silicon ingot comprising at least one dopant material, which is preferably a continuous Czochralski method.

10 Claims, 2 Drawing Sheets

(51) Int. Cl.
  *C30B 15/12* (2006.01)
  *H01L 31/18* (2006.01)
  *C30B 15/00* (2006.01)

(52) U.S. Cl.
  CPC .......... *H01L 31/182* (2013.01); *Y02E 10/546* (2013.01); *Y02P 70/521* (2015.11); *Y10T 117/1052* (2015.01); *Y10T 117/1056* (2015.01)

(58) Field of Classification Search
  CPC .............. Y02E 10/546; Y10T 117/1052; Y10T 117/1056
  USPC ..... 117/18, 19, 21, 22, 30, 31, 33, 200, 213, 117/214, 217, 218, 932; 423/348; 438/97
  See application file for complete search history.

(56) References Cited

U.S. PATENT DOCUMENTS

| | | | |
|---|---|---|---|
| 5,324,488 A * | 6/1994 | Klingshirn et al. | .......... 117/213 |
| 5,900,055 A * | 5/1999 | Nagai | ..................... C30B 15/04 117/18 |
| 8,434,511 B2 | 5/2013 | Williams et al. | |
| 2005/0092236 A1 | 5/2005 | Bender | |
| 2007/0056504 A1 | 3/2007 | Lim | |
| 2011/0030793 A1* | 2/2011 | Kraiem | ................... C30B 11/00 136/261 |

FOREIGN PATENT DOCUMENTS

| | | | |
|---|---|---|---|
| EP | 0 798 403 A1 | 10/1997 | |
| JP | 63-079790 | 4/1988 | |
| JP | 02-018377 A | 1/1990 | |
| JP | EP 0350305 A2 * | 1/1990 | ............. C30B 15/04 |
| JP | 02-083292 | 3/1990 | |
| JP | 02083292 A * | 3/1990 | |
| JP | 06-076273 | 9/1994 | |
| JP | 09-263492 | 10/1997 | |
| JP | 2001-240495 A | 9/2001 | |
| JP | 2002-128591 A | 5/2002 | |

OTHER PUBLICATIONS

European Search Report dated Jul. 24, 2014 issued in connection with EP 12771909.
Office Action dated Jun. 25, 2015 issued in connection with Chinese Application No. 201280028191.1, with English translation.
Office Action dated Nov. 17, 2015 in connection with Taiwan Application No. 101113441, with English translation.
Wolf et al., "Silicon Processing for the VLSI ERA", vol. 1: Process Technology, Lattice Press, 1986, pp. 5-21.
Kraiem et al., "Doping Engineering as a Method to Increase the Performance of Purified MG Silicon During Ingot Crystallisation", Photovotaic Specialist Conference (PFSC), 209 34th IEEE 978-1-34244-2950-9/09 (2010), pp. 1327-1330.
Dubois et al., "Effects of the Compensation Level on the Carrier Lifetime crystalline Silicon", Applied Physics Letter 93 (2008), pp. 032114-032117.
Office Action dated Aug. 26, 2015 in connection with Japanese Application No. 2014-505353, with English translation.

* cited by examiner

SILICON INGOT HAVING UNIFORM MULTIPLE DOPANTS AND METHOD AND APPARATUS FOR PRODUCING SAME

CROSS-REFERENCE TO RELATED APPLICATIONS

The present application claims the benefit of U.S. Provisional Patent Application No. 61/475,351, filed Apr. 14, 2011.

BACKGROUND OF THE INVENTION

1. Field of the Invention

The present invention relates to Czochralski growth of silicon and, in particular, to continuous Czochralski growth of a silicon ingot having axially uniform doping.

2. Description of the Related Art

Among the many types of photovoltaic solar cells being developed, one of the most efficient and economical cells is based on silicon wafers grown by the Czochralski method. In the typical Czochralski (CZ) method, silicon is melted in a crucible to its liquid state at a temperature of about 1416° C. A small crystalline silicon seed of predetermined crystalline orientation is contacted with the melt and then gradually withdrawn. With proper control of temperatures, the liquid silicon freezes on the crystalline seed with the same orientation as that of the seed. The seed is then slowly raised away from the melt to form a growing crystalline ingot of silicon having a final length of a meter or more and a diameter of hundreds of millimeters In typical integrated circuit substrate applications, batch CZ is practiced in which the crucible is filled with an initial charge of electronic grade (EG) silicon, also called virgin poly or simply polysilicon. The crucible is then heated, and one ingot is drawn to substantially deplete the crucible. The crucible is then discarded after one ingot. The cooled ingot is sliced to form circular monocrystalline wafers having a thickness of substantially less than a millimeter. See Wolf and Taber, Silicon Processing for the VLSI Era, vol. 1: Process Technology, Lattice Press, 1986, pp. 5-21, incorporated herein for reference, for discussions about electronic grade silicon, metallurgical grade silicon and the typical Czochralski process.

Solar cell applications, however, are much more cost sensitive than silicon integrated circuits. One approach is to charge the CZ crucible with metallurgical grade (MG) silicon. MG silicon is relatively impure compared to EG silicon since the steps of distillation and chemical vapor deposition required for EG silicon are avoided, but MG silicon is much more readily available. Compensated MG silicon wafers have been shown to exhibit solar efficiencies approaching those of EG silicon wafers; however, the level of compensation must be tailored for the cell design. For example, a photovoltaic solar cell can be formed with a p-n junction separating a semiconductor p-type region, for example doped with boron, aluminum, or gallium, from a semiconductor n-type region, for example doped with phosphorous. Often the ingot intended for solar usage will be grown with a given doping type, for example, p-type, and the wafers cut from the ingot will have their surfaces doped n-type to form the p-n junction. Compensated silicon ingots may be grown by the CZ method having both p- and n-type dopants. The effective doping type and concentration is determined by which dopant has the higher concentration and the difference of the concentrations of the two dopants. Some studies have shown that minority carrier lifetime is actually higher in strongly compensated silicon and suggested that higher efficiency solar cells can be achieved by controlling the concentrations of dopant impurities, e.g., both boron and phosphorous. See, Kraiem et al., Doping engineering as a method to increase the performance of purified MG silicon during ingot crystallization, Photovoltaic Specialists Conference (PVSC), 209 34th IEEE 978-1-34244-2950-9109 (2010), pp. 1327-1330 and Dubois et al., Beneficial effects of the compensation level on the carrier lifetime of crystalline silicon, Applied Physics Letters, 93 (2008), pp. 032114-032117, both incorporated by reference.

However, controlled doping and particularly counter-doping in the Czochralski method or by casting is complicated by segregation effects. Segregation is the tendency of an impurity or dopant to remain in the melt during solidification, with the effect that the concentration of a dopant on the liquid side of the solid-liquid interface is different, usually greater, than that on the solid side. The segregation phenomenon is characterized by a "segregation coefficient", denoted as k, which is the ratio of the concentration of dopant on the solid side of the solidification interface to the concentration of the same dopant on the liquid side of the solidification interface. Different dopants have different segregation coefficients in silicon and they are usually less than 1.0, sometimes much less. TABLE 1 presents values of the segregation coefficient for a number of possible dopants in silicon.

TABLE 1

| Element | k |
|---|---|
| B | 0.8 |
| P | 0.35 |
| Ga | 0.008 |
| In | 0.0004 |
| As | 0.3 |
| Al | 0.002 |

As a result, with a fixed charge of silicon and dopant in the crucible, the concentration of dopant in the liquid increases as the solidification progresses. However, the increased dopant concentration in the melt causes a concomitant increase in dopant concentration in the portion of crystal later grown from the melt.

Thus the segregation phenomenon for typical processing of MG silicon, either by casting or batch CZ, typically leads to increasing concentration of dopant in the melt and therefore also in the resulting crystal, with continued depletion of the molten silicon in the crucible. The rate of increase of impurity concentration depends on the segregation coefficient. A dramatic example of this is seen in casting of MG silicon containing both boron and phosphorus dopants for which a crystal (or polycrystal) grows as boron-dominated silicon (p-type) in portions that solidify first but ends up phosphorous-dominated (n-type) in portions that solidify last because the initial silicon charge has both elements, which are taken up at different rates. Because all dopants have unique segregation coefficients and thus build up in the liquid at different rates, it has hitherto been impossible to manufacture silicon ingots with uniform doping concentrations (or concentration ratios) of elements with significantly different segregation coefficients using standard casting and CZ ingot manufacturing approaches.

Another type of Czochralski (CZ) growth, often called continuous Czochralski (CCZ) has been known for many years but has not been widely practiced. It has recently been suggested for solar use. See U.S. Pat. No. 7,635,414 to Bender and US patent application publication 2011/0006240 to Williams et al. In CCZ, multiple ingots are pulled from a single crucible that is replenished during growth. The crucible, which can include both a growth zone and a feed zone, is typically discarded and replaced by a fresh crucible after a fixed number of ingot cycles. As a result, only a fresh crucible is pre-charged, in which a charge is, for the most part, manually loaded into an unheated crucible and placed into a crystal growth system. It is therefore possible to pre-charge different concentrations of dopants into the growth and feed zones of the crucible. However, the effect of segregation is magnified when multiple ingots are produced.

Therefore, there is a need in the industry for a method of producing silicon ingots having at least one dopant, particularly multiple dopants, in which each ingot has substantially constant dopant concentrations, as well as a system for producing such ingots.

SUMMARY OF THE INVENTION

The present invention relates to a Czochralski growth system, comprising a crucible, a silicon delivery system comprising a feeder having a delivery point overhanging the crucible and delivering a controllable amount of silicon into the crucible, and at least one doping mechanism controllably delivering at least one dopant material to the silicon delivery system, and preferably to the feeder, to thereby deliver dopant material to the crucible. The feeder preferably comprises a trough system, and the dopant material is delivered to the trough system. The Czochralski growth system can comprise two or more doping mechanisms each loaded with a different dopant material. Preferably, the crucible comprises an inner growth zone in fluid communication with an outer feed zone, and the feeder delivers the silicon and dopant material into the outer feed zone.

The present invention further relates to a method of Czochralski growth of a silicon ingot comprising a dopant material in a concentration C, wherein the dopant material has a segregation coefficient of k. The method comprises the steps of providing a crucible having an inner growth zone in fluid communication with an outer feed zone and pre-charging the inner growth zone with silicon and the dopant material. In one embodiment, the inner growth zone is pre-charged with silicon and dopant to form a mixture which, when melted, has a concentration of the dopant of C/k. The mixture is then melted, and growth of the silicon ingot from the inner growth zone is initiated. A feed of silicon and the dopant material is delivered into the outer feed zone while growing the silicon ingot, wherein the feed, when melted, has an average concentration of the dopant material of C. The silicon ingot can then be removed and comprises the dopant material in concentration C. Preferably, after growing the silicon ingot, the method further comprises the step of initiating growth of a second silicon ingot comprising the dopant material in a concentration of C without pre-charging the crucible again. Thus, preferably the method of the present invention is a continuous Czochralski growth method. In a second embodiment, after pre-charging the inner growth zone with silicon and dopant material, the method comprises the steps of initiating growth of the silicon ingot from the inner growth zone; maintaining, in the inner growth zone, a first concentration of the dopant material in silicon while growing the silicon ingot; and maintaining, in the outer feed zone, a second concentration of the dopant material in silicon while growing the silicon ingot, wherein the second concentration is less than the first concentration. The silicon ingot can them be removed and comprises the dopant material in concentration C. Preferably, the Czochralski growth system of the present invention is used for embodiments of this Czochralski growth method.

The present invention further relates to at least one silicon ingot having a substantially constant counter-doping concentration along its axis. Preferably, the present invention relates to a plurality of silicon ingots, each having the same substantially constant counter-doping concentration along their axes. The silicon ingots can be grown using the Czochralski growth method of the present invention and/or using the Czochralski growth system of the present invention.

It is to be understood that both the foregoing general description and the following detailed description are exemplary and explanatory only and are intended to provide further explanation of the present invention, as claimed.

DETAILED DESCRIPTION OF THE INVENTION

Figure 1:
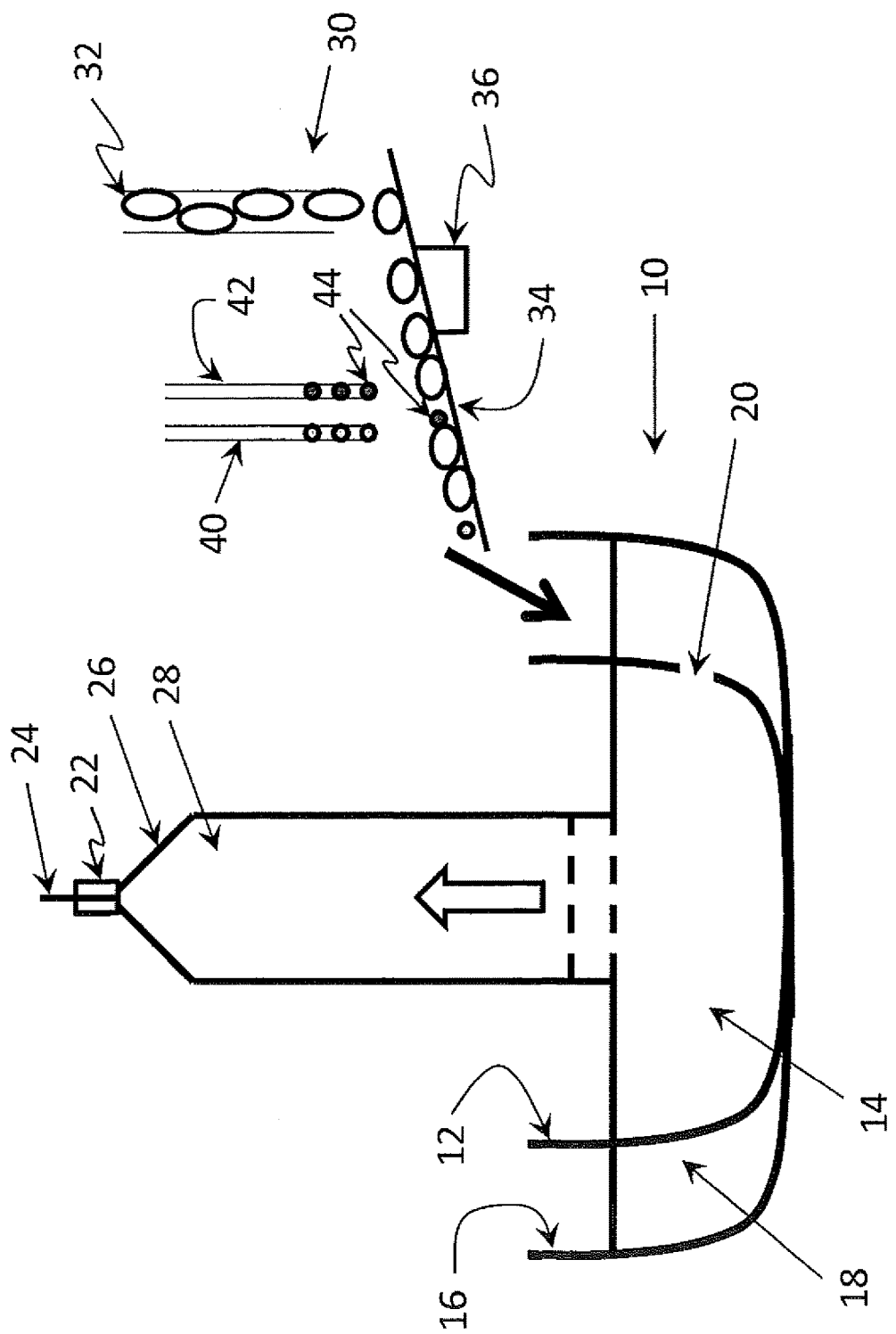
FIG. 1 and FIG. 2 are schematic views of embodiments of a Czochralski growth system and method of the present invention.

The present invention relates to methods of Czochralski growth of a silicon ingot, as well as to Czochralski growth systems and ingot produced therefrom.

The Czochralski growth system of the present invention comprises a crucible, a silicon delivery system, and at least one dopant mechanism. The crucible can be any known for use in silicon crystal growing that is capable of containing both solid and liquid silicon feedstock. For example, the crucible can be a quartz crucible or can be a graphite crucible containing a quartz inner liner. The crucible can also have any cross-sectional shape depending, for example, on the geometry of the crystal growth system, but typically has a circular cross-sectional shape. Preferably, the crucible comprises an inner growth zone and an outer feed zone, and these zones are in fluid communication with each other. For example, the crucible can comprise a wall or other separating means that divides the crucible into the inner and outer zones. The separator has an opening, such as a hole or pipe, which provides restricted fluid communication between the two zones so that, as material is removed from the inner growth zone by the crystallization process, fresh material can enter from the feed zone.

The Czochralski growth system of the present invention further comprises a silicon delivery system, which provides silicon, such as electronic grade silicon, metallurgical grade silicon, or solar grade silicon, to the crucible either prior to or, preferably, while a silicon ingot is being grown and drawn. Thus, preferably, the silicon delivery system is capable of delivering silicon while the crucible is heated and contains molten silicon. The silicon can be delivered in either solid or molten form. The silicon delivery system preferably comprises a feeder, which can be any means for conveying silicon to the crucible known in the art. For example, the feeder can comprise a trough system through which a controlled amount of silicon is provided to the crucible. The feeder has at least one delivery point that overhangs the crucible. When the crucible comprises an inner growth zone and an outer feed zone, the silicon delivery system can provide silicon to either zone, but it is preferred to deliver silicon to the outer feed zone of the crucible in order to minimize disturbance of the molten silicon in the inner growth zone while the crystal is pulled.

The Czochralski growth system of the present invention further comprises at least one dopant mechanism, which is the means for providing at least one dopant to the crucible. While any means for delivering dopant known in the art can be used, the at least one dopant mechanism used in the Czochralski growth system of the present invention delivers the dopant or dopants to the silicon delivery system, and preferably the feeder, rather than to the crucible directly. If the feeder comprises a trough system, preferably the at least one dopant mechanism provides dopant to the trough system. Thus, at least one dopant is provided to the silicon delivery system, which thereby delivers both silicon and dopant to the crucible. In this way, improved control over dopant concentrations can be achieved.

One or more dopants can be supplied with the silicon, and this can occur both during pre-charge and during silicon feeding in the method of the present invention, described in more detail below. Any dopant known in the art can be used, including, for example, n-type dopants such as phosphorus and p-type dopants such as boron, gallium, indium, or aluminum. Two types of dopants of different conductivity types delivered at separately controllable rates allow the counter-doping of metallurgical grade silicon in forming an ingot having relatively uniform doping of multiple dopants along its axis. However, in some applications multiple dopants of the same conductivity type may be supplied at respectively controlled rates for other purposes, such as increasing the radial uniformity of doping in the ingot or reducing the deleterious effects of defects associated with one or the other of dopants.

Two specific embodiments of the Czochralski growth system of the present invention are shown in FIG. 1 and in FIG. 2, both illustrated in a schematic view, and discussed below. However, it should be apparent to those skilled in the art that these are merely illustrative in nature and not limiting, being presented by way of example only. Numerous modifications and other embodiments are within the scope of one of ordinary skill in the art and are contemplated as falling within the scope of the present invention. In addition, those skilled in the art should appreciate that the specific configurations are exemplary and that actual configurations will depend on the specific system. Those skilled in the art will also be able to recognize and identify equivalents to the specific elements shown, using no more than routine experimentation.

Figure 2:
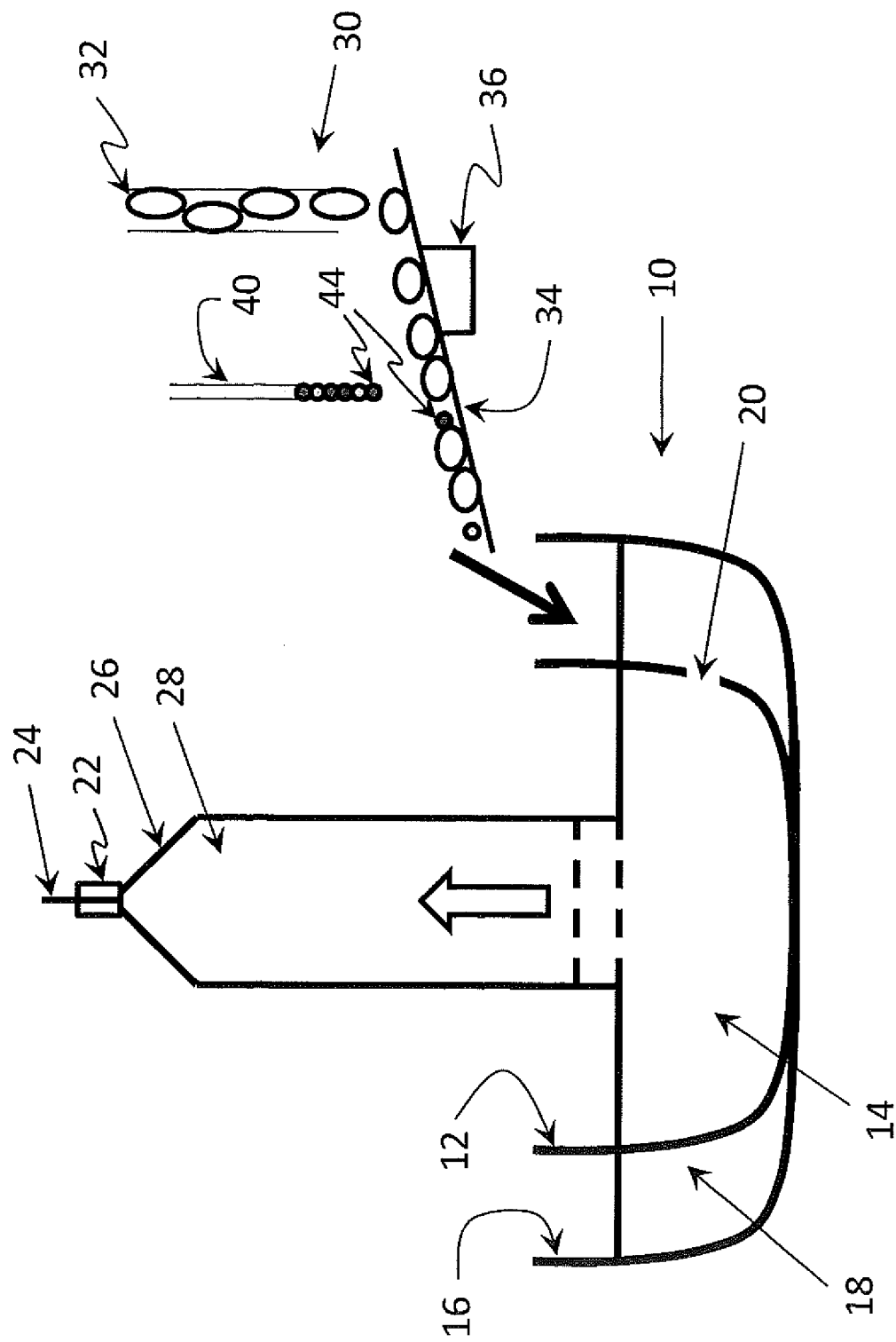

As shown in FIG. 1 and FIG. 2, the systems include double crucible 10 which has a circular cross section and is, for example, made of fused quartz. Unillustrated heaters heat crucible 10 and the solid silicon contained therein to a temperature typically of around 1420° C. Inner wall 12 defines circular inner growth zone 14 and, outer wall 16 defines, together with inner wall 12, annular outer feed zone 18. Thus, inner wall 12 separates crucible 10 into two separate zones. Opening 20 in inner wall 12 provides restricted fluid communication between inner growth zone 14 and outer feed zone 18 so that the two zones have generally equilibrated upper surfaces. The crucible may have additional walls defining additional zones as well as other flow controls.

Also, the Czochralski growth systems shown in FIG. 1 and FIG. 2 both comprise silicon feeding mechanism 30 which supplies a predetermined amount or rate of undoped solid silicon 32, which can be in a variety of shapes including pellets or shards, onto feed trough 34 having an integrated or separate feed spout as the delivery point overhanging outer feed zone 18. For these particular examples, trough 34 is mounted on vibrator 36, for which the timing and amplitude of the vibrations may be controlled to move silicon 32 down trough 34 and may control the feed amount or rate, although other feeders and feed mechanisms known in the art may be used.

FIG. 1 illustrates an embodiment that can, in particular, be useful for counter-doping in which first dopant mechanism 40 for a first dopant, such as boron, and second dopant mechanism 42 for a second dopant, such as phosphorous, are positioned over trough 34 and separately and independently supplied into the stream of silicon particles 32 in trough 34. Doping mechanisms 40 and 42 may be in the form of dispensers, which under controller command dispense solid pills 44 of dopant having a predetermined shape (such as spherical or cubic) appropriate for the dispenser. Solid pills 44 may include components in addition to the dopant, including a binder, carrier, or capsule. For example, solid silicon heavily doped with boron can form the boron pill for the growth of lesser doped silicon ingot. Each pill 44 contains a predetermined amount of the respective dopant. With two separately controlled doping mechanisms 40 and 42 loaded with pills 44 of the respective doping types. With two separately controlled doping mechanisms 40 and 42 loaded with pills 44 of the respective doping types, the doping concentrations of both species can be controlled relative to silicon for both a pre-charge and for continuous feeding.

A second embodiment of the Czochralski growth system of the present invention, illustrated schematically in FIG. 2, includes a single doping mechanism 40. This embodiment is useful when one dopant or doping type is to be added to the silicon feed. For example, silicon containing a known amount of a first dopant material may be used both as the pre-charge to the crucible as well as the silicon feed after ingot growth has been initiated. A second different dopant may be delivered to this doped silicon feed using the single doping mechanism. Alternatively, additional amounts of the first dopant may be provided, to compensate for the effects of the segregation coefficient. In addition, this embodiment is also useful for multiple dopants once the doping sequence and relative concentrations have been determined. For example, pills 44 of different doping types may be stacked into a single dispenser in a predetermined order to provide the desired doping concentrations.

The present invention further relates to a method of Czochralski growth of at least one silicon ingot comprising at least one dopant material in a concentration C and having a segregation coefficient k. The dopant material can be any of those described above. Furthermore, while any apparatus known in the art capable of growing a silicon ingot by a Czochralski growth method can be used, preferably the method of the present invention utilizes the Czochralski growth system of the present invention. The method comprises the steps of providing a crucible having an inner growth zone in fluid communication with an outer feed zone, and pre-charging the inner growth zone (i.e., before initiating growth of the silicon ingot) with silicon and the dopant material or materials. Preferably, the outer feed zone of the crucible is also pre-charged with silicon and dopant material. Any pre-charging method known in the art can be used. For example, a portion of the initial charge can be stacked in the crucible before the crystal grower chamber is closed, and the remainder can be fed into the crucible in a process sometimes called "topping off" before ingot drawing begins. Material supplied into and melted in the outer feed zone will eventually pass through to the inner growth zone. Pre-charging is continued until the upper surface of the melt reaches the operational level.

In one embodiment of the method of the present invention, the inner growth zone of the crucible is pre-charged with silicon and dopant to form a pre-charge mixture, and the amounts of silicon and dopant are such that, when melted, the dopant concentration in the resulting melt would be C/k. The total amount would depend on the size of the crucible and on the size of the inner growth zone. For this first embodiment, preferably the outer feed zone of the crucible is also pre-charged with silicon and dopant material, and the amounts are such that, when melted, the melt would have a concentration of dopant material of C. Thus, preferably, prior to silicon ingot growth, the concentration of dopant material in the inner growth zone of the crucible is C/k and the concentration of dopant material in the outer feed zone is C.

After pre-charging, the mixture is then melted, and growth of a silicon ingot is initiated from the inner growth zone. Any technique known in the art for growing an ingot by a Czochralski method can be used to initiate growth in the present method. For example, as shown in FIG. 1 and FIG. 2, seed 22 of crystalline silicon of fixed crystalline orientation can be clamped to cable 24 and lowered to the surface of growth zone 14 containing the melted mixture. With proper control of temperature and pull rate, molten silicon freezes on seed 22 with the same crystalline orientation as that of the seed. Seed 22 is then slowly raised, and the crystallization process continues. The diameter of the crystallize material increases in crown region 26 but the pull rate is then increased and ingot 28 of crystalline silicon, having a generally cylindrical shape, is slowly drawn from the melt. After the ingot has been grown to its desired length, typically about 1 or 2 meters, the pull rate can be increased so as to form a tail region (not shown), and the resulting ingot can then separated from the melt.

For this first embodiment of the method of the present invention, while the silicon ingot grows, an amount of silicon and additional dopant is delivered to the crucible, preferably to the outer feed zone, in order to maintain a relatively constant amount of material in the inner growth zone. The dopant can be in any form available, including those described above. However, since typical dopants are powders, it may be preferable to provide the dopant material as an alloy in silicon, including, for example, pieces removed from portions of previously grown silicon ingots. In addition, the amounts of the silicon and dopant material are chosen so that the feed when melted has an average concentration of the dopant material of C. Thus, silicon and dopant can be continuously fed in a stream having a constant dopant concentration of C when melted or, alternatively, the silicon can be continuously fed to the crucible while dopant material is added to the silicon feed in stages during the feeding step. If the dopant material is added in discreet stages, the frequency of dopant addition and the amount of dopant material added are adjusted so that the concentration of dopant material throughout the feeding step would, on average, be C. Stepwise addition of dopant material may be preferred since, typically, the total amount of dopant material to be added is small relative to the amount of silicon and since the time over which the addition would take place is typically long, requiring very small amounts of material being added to maintain a constant concentration of dopant in the feed. Also, once the silicon/dopant material feed enters, for example, the outer feed zone of the crucible, melting takes place over time, causing the concentration of dopant in the melt in the outer feed zone to equilibrate. The feed of the silicon and dopant continues as the silicon ingot grows. Once grown, the desired silicon ingot, comprising the dopant material in a concentration C can then be removed.

In a second embodiment of the method of the present invention, after the inner growth zone of the crucible is charged, growth of the silicon ingot is initiated from the inner growth zone. While the ingot is grown, the concentration of the dopant material in the inner growth zone is maintained at a first concentration, and the concentration of the dopant material in the outer feed zone is also maintained, but at a different, second concentration. For this embodiment, the second concentration is less than the first concentration. Preferably, the dopant concentration in the outer feed zone is maintained by supplying silicon and dopant material to the outer feed zone, which can occur using any of the techniques described above. By maintaining a higher concentration of dopant material in the inner growth zone compared to the concentration in outer feed zone, a silicon ingot can be produced comprising dopant material in the desired final concentration.

For both embodiments of the method of the present invention, the ingot or ingots produced can comprise one or more dopants. For example, a silicon ingot can comprise two different dopant materials—a first dopant material having a segregation coefficient of $k_1$ and, further, a second dopant material having a segregation coefficient of $k_2$. The concentration of the first dopant material in the ingot is $C_1$, and the concentration of the second dopant material in the ingot is $C_2$. In this example, the inner growth zone is pre-charged with silicon, along with both the first dopant material and the second dopant material to form a mixture which, when melted, would have a concentration of the first dopant material of $C_1/k_1$ and a concentration of the second dopant material of $C_2/k_2$. The outer feed zone is then fed with silicon and both the first and second dopant materials as the silicon ingot is grown. The feed, when melted, has a concentration of the first dopant material of $C_1$ and a concentration of the second dopant material of $C_2$. Similarly, the method of the present invention can be used to produce an ingot having more than two dopants.

In general, for the method of the present invention, the pre-charge provided to the crucible takes into account both the desired doping concentrations in the final ingot as well as the segregation coefficients $k_i$ of the respective dopant materials. In particular, for a grown ingot containing for each weight N of silicon, a weight $n_i$ of the i-th dopant having a segregation coefficient $k_i$, the pre-charge in the inner growth zone should then contain a ratio of $$\frac{ni}{ki\,N}$$

of the i-th dopant to the silicon. The pre-charge in the outer feed zone, if used, should preferably contain a ratio of $$\frac{ni}{N}$$

of the i-th dopant to the silicon. During growth, if dopant material is provided as an alloy with silicon, such as solid pills described above, containing respectively $L_i$ atoms per pill, the pills can be released periodically with a silicon feed interval $$Mi = \frac{Li}{Ci}$$

These equations would apply for each of the multiple dopants i. The absolute amount of silicon in the pre-charge is that amount necessary to fill the crucible, corrected as may be needed for the silicon content of the dopant-containing pills. The initial dopant charging amounts given above provide the steady-state concentration profile in the melt when the dopant material in the inner growth zone is well mixed and there is no backward transmission of dopant material or melt through into the outer feed zone. With relatively long time constants for back mixing of dopant material from the inner growth zone to the outer feed zone, dictated, for example, by the size of the opening between them, it has therefore been found feasible to maintain dopant concentrations of $C_i/k_i$ in the inner growth zone and $C_i$ in the outer feed zone 18 during both the pre-charge and between ingot cycles. Further refinements are also possible. For example, the amount of a dopant material to be supplied can also be corrected for differential evaporation rates. This may be particularly useful when the dopant material is gallium and, to a lesser extent, indium or aluminum, which tend to evaporate much more readily than silicon.

It has been found that the methods and systems of the present invention produce silicon ingots having improved overall properties, especially when more than one dopant material is used. In particular, better axial control of the concentration of the dopant material(s) are found in Czochralski grown silicon ingots produced according to the present invention. As discussed above, constant counter-doping concentrations are desirable for several applications but are complicated by the variability in dopant segregation. The present invention therefore provides a method and system for producing uniform silicon ingots containing multiple dopants, and, thus further relates to a silicon ingot having a substantially constant counter-doping concentration along its axis.

One or multiple ingots may be produced using the methods and/or systems of the present invention. For example, the method of the present invention can comprise the steps of growing a first silicon ingot from the crucible containing at least silicon and one or more dopants and, subsequently, growing one or more additional silicon ingots from the same inner growth zone. Preferably, once the inner growth zone of the crucible is initially charged (i.e., pre-charged), one or a plurality of ingots having the desired concentration of dopant or dopants are grown without repeating the pre-charging step. The grown ingot is removed from the system, and the process is repeated for another ingot. Thus, preferably, the Czochralski growth method of the present invention is a continuous Czochralski growth method. In continuous Czochralski, the crucible is discarded and replaced by a fresh crucible after a significant number of ingot cycles or if the melt cools down and solidifies or other malfunction occurs. As a result, only a fresh crucible is pre-charged. Continuous Czochralski allows several ingot cycles to be run with a single crucible and a single pre-heating and pre-charge period Furthermore, since, as the silicon ingot grows, silicon is thereby removed from the inner growth zone as well as the outer feed zone, being in fluid communication with the inner growth zone, such as through an opening, the overall level of the melt is lowered. In continuous Czochralski, more silicon is supplied, at least intermittently, during the drawing of an ingot to compensate for this loss of silicon. In the present invention, in addition to silicon, dopant levels are also controlled and maintained, and multiple doped silicon ingots having substantially constant dopant and, preferably, counter-dopant concentrations are thereby produced.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of Czochralski growth of a silicon ingot comprising a dopant material in a concentration C and having a segregation coefficient of k, the method comprising the steps of:
    i) providing a crucible having an inner growth zone in fluid communication with an outer feed zone;
    ii) pre-charging the inner growth zone with silicon and the dopant material to form a mixture, wherein the mixture, when melted, has a concentration of the dopant material of C/k, where k is less than 1, and pre-charging the outer feed zone with silicon and the dopant material in a concentration C, when melted,
    iii) melting the mixture in the inner growth zone and the silicon and the dopant material in the outer feed zone;
    iv) initiating growth of the silicon ingot from the inner growth zone;
    v) delivering a feed of silicon and the dopant material into the outer feed zone while growing the silicon ingot, the feed having an average concentration of the dopant material C when melted; and
    vi) removing the silicon ingot comprising the dopant material in concentration C.

2. The method of claim 1, wherein the silicon ingot comprises a single dopant material.

3. The method of claim 1, wherein the silicon ingot comprises multiple dopant materials.

4. The method of claim 1, wherein the silicon ingot comprises a first dopant material in a concentration $C_1$ and having a segregation coefficient of $k_1$ and further comprises a second dopant material in a concentration $C_2$ and having a segregation coefficient of $k_2$;
    the inner growth zone is pre-charged with silicon, the first dopant material, and the second dopant material to form a mixture, wherein, when melted, the mixture has a concentration of the first dopant material of $C_1/k_1$ and a concentration of the second dopant material of $C_2/k_2$; and
    the outer feed zone is fed with silicon, the first dopant material in a concentration of $C_1$ when melted, and the second dopant material in a concentration of $C_2$ when melted.

5. The method of claim 4, wherein the first dopant material and the second dopant material have different semiconductivity types.

6. The method of claim 4, wherein the first dopant material is phosphorus and the second dopant material is boron.

7. The method of claim 1, wherein the dopant material is phosphorus, boron, gallium, indium, or aluminum, arsenic, antimony.

8. The method of claim 1, wherein, after growing the silicon ingot, the method comprises the step of initiating the growth a second silicon ingot comprising the dopant material in concentration C without pre-charging the crucible again.

9. The method of claim 1, wherein, after growing the silicon ingot, the method comprises the step of growing a plurality of ingots comprising the dopant material in concentration C after pre-charging the inner growth zone.

10. The method of claim 1, where the method is a continuous Czochralski growth method.

\* \* \* \* \*